(12) United States Patent
Correll et al.

(10) Patent No.: US 9,436,233 B2
(45) Date of Patent: Sep. 6, 2016

(54) REDUNDANT POWER SUPPLY MOTHERBOARD ASSEMBLY

(71) Applicant: Phoenix Contact Development and Manufacturing, Inc., Middletown, PA (US)

(72) Inventors: Michael Anthony Correll, Hershey, PA (US); Brian John Gillespie, Hummelstown, PA (US); Terry Lee Barber, Harrisburg, PA (US)

(73) Assignee: Phoenix Contact Development and Manufacturing, Inc., Middletown, PA (US)

(*) Notice: Subject to any disclaimer, the term of this patent is extended or adjusted under 35 U.S.C. 154(b) by 0 days.

(21) Appl. No.: 14/695,547

(22) Filed: Apr. 24, 2015

(65) Prior Publication Data

US 2015/0362964 A1    Dec. 17, 2015

Related U.S. Application Data

(62) Division of application No. 14/676,301, filed on Apr. 1, 2015.

(60) Provisional application No. 62/012,469, filed on Jun. 16, 2014.

(51) Int. Cl.
| | |
|---|---|
| *H05K 7/00* | (2006.01) |
| *H05K 5/00* | (2006.01) |
| *G06F 1/18* | (2006.01) |
| *G06F 1/26* | (2006.01) |
| *H01T 4/06* | (2006.01) |
| *H05K 7/14* | (2006.01) |

(52) U.S. Cl.
CPC ............... *G06F 1/184* (2013.01); *G06F 1/181* (2013.01); *G06F 1/185* (2013.01); *G06F 1/188* (2013.01); *G06F 1/189* (2013.01); *G06F 1/26* (2013.01); *H01T 4/06* (2013.01); *H05K 7/14* (2013.01); *H05K 7/1477* (2013.01); *H05K 7/1482* (2013.01)

(58) Field of Classification Search
CPC .............................. F16H 61/00; H05K 7/1465
USPC ........................................ 361/679.01–679.03
See application file for complete search history.

(56) References Cited

U.S. PATENT DOCUMENTS

| | | |
|---|---|---|
| 6,535,397 B2 | 3/2003 | Clark et al. |
| 6,700,477 B2 | 3/2004 | Schwarz et al. |
| 7,508,690 B2 | 3/2009 | Albers |

(Continued)

FOREIGN PATENT DOCUMENTS

| | | |
|---|---|---|
| DE | 102012213258 A1 | 1/2014 |
| WO | 2013020819 A1 | 2/2013 |

OTHER PUBLICATIONS

International Search Report in corresponding PCT/US2015/028428, European Patent Office, dated Jul. 23, 2015, 10 pages.

(Continued)

*Primary Examiner* — Jerry Wu
(74) *Attorney, Agent, or Firm* — Hooker & Habib, P.C.

(57) ABSTRACT

A redundant power supply motherboard assembly connects control segments of a fieldbus-type control system to a host computer. The assembly has a compact design with pairs of power supply modules mounted in nests on the motherboard. The nests securely hold the modules to prevent contact impairment due to vibrations, shocks and handling.

18 Claims, 10 Drawing Sheets

(56) References Cited

U.S. PATENT DOCUMENTS

| | | | |
|---|---|---|---|
| 8,123,545 B1* | 2/2012 | Correll | H05K 7/1471 439/352 |
| 8,379,398 B2 | 2/2013 | Correll et al. | |
| 2004/0035245 A1* | 2/2004 | Albert | F16H 61/0006 74/606 A |
| 2005/0018388 A1 | 1/2005 | Shih | |
| 2012/0206848 A1 | 8/2012 | Gillespie et al. | |
| 2012/0243190 A1* | 9/2012 | Correll | H05K 7/1465 361/756 |
| 2013/0045613 A1 | 2/2013 | Griese et al. | |

OTHER PUBLICATIONS

Machine translation of DE 102012213258.
Pepperl + Fuchs, Compact Fieldbus Hub, MBHC-FB-8R.YO, Data Sheet, 4 pages.
Pepperl + Fuchs, Drawing, MBHC-FB-8R,YO, 1 page.
Pepperl + Fuchs, Compact Fieldbus Hub, MBHC-FB-8R.RH, Data Sheet, 4 pages.
Pepperl + Fuchs, Compact Fieldbus Hub, MBHC-FB-8R-RH, Photographs, 4 pages.
Pepperl + Fuchs, Universal Fieldbus Power Hub, MB-FB-4R.YO, Data Sheet, 4 pages.
Pepperl + Fuchs, High-Density Fieldbus Power Hub, MBHD-FB1-4R.YO, Data Sheet, 4 pages.
Pepperl + Fuchs, Motherboard, MBHD-FBI-4R, Photographs, 2 pages.
Pepperl + Fuchs, Universal Fieldbus Power Hub, MB-FB-4R.GEN, Data Sheet, 5 pages.
Pepperl + Fuchs, Motherboard and assembly, MB-FB-4R.Gen, Photographs, 5 pages.
Pepperl + Fuchs, Fieldbus Power Hub, MB-FB-GTR, Photographs, 2 pages.
Pepper + Fuchs, Motherboard for Honeywell power supply modules, Photographs, 3 pages.
Cooper Crouse-Hinds, Redundant tieldbus power for Yokogawa, Data Sheet, 5 pages.
Cooper Crouse-Hinds, Redundant fieldbus power for Yokogawa, Data Sheet, 4 pages.
Turck, Motherboard assembly, DPC-49-4RMB, Photographs, 3 pages.
Relcom, Inc., Motherboard assembly, F892-CA, Photographs, 2 pages.

* cited by examiner

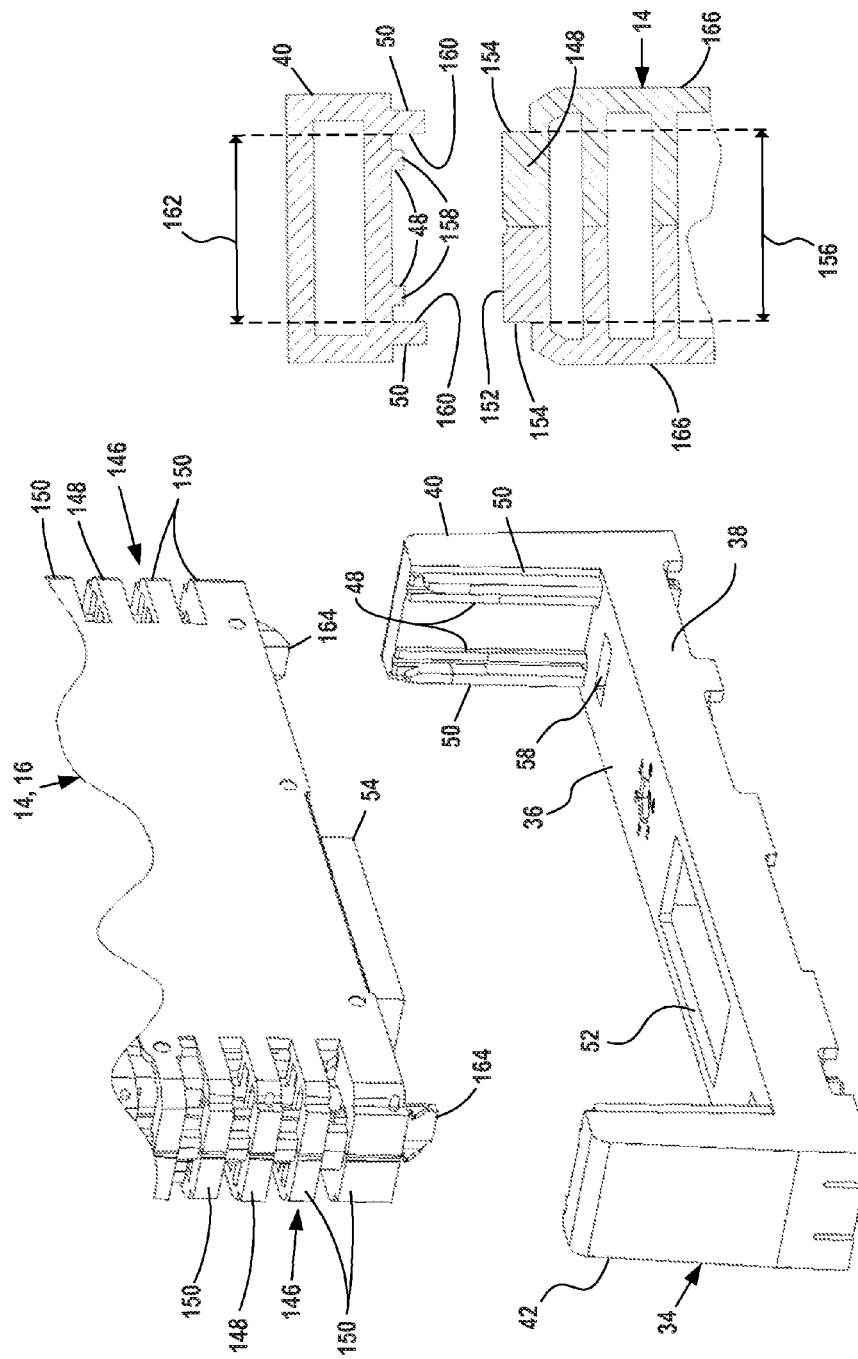

REDUNDANT POWER SUPPLY MOTHERBOARD ASSEMBLY

Complex industrial systems are typically operated by fieldbus-type systems having a number of control segments which are connected to a host computer with a HMI. Industrial components are spaced along the control segments. The components may include valves, heaters, switches, motors, sensors and the like used in the industrial system. The segments communicate AC signals between the host and the components in each segment and supply DC power to the components.

Motherboard assemblies are used to connect the segments to the host and to supply DC power to the segments. The assemblies are connected to one or more bulk power supplies and typically include redundant power supply modules and a diagnostic module. The power supply modules provide back-up power to each control segment in the event of power failure. Redundant power supply modules assure uninterrupted power is supplied to each segment despite failure of bulk power or of one of the two power supply modules for the segment. Failed power supply modules may be physically replaced without requiring that the assembly be disconnected from the bulk power supply to make the replacement.

The diagnostic module provides information to the host on the operation of the motherboard assembly, power supply modules and control segments.

Power supply and diagnostic modules used in motherboard assemblies have a fixed width which determines the minimum length of the motherboard assembly. The motherboard assembly may support four redundant pairs of power supply modules and a single diagnostic module. The modules are mounted side-by-side along the length of the assembly so that the assembly length is slightly greater than the width of the nine modules.

In the disclosed motherboard assembly, each module is mounted in a nest secured to the top of the motherboard. The nests are spaced side-by-side along the length of the motherboard. Central portions of the nests are weakened due to wide openings for contact noses on the modules. The nests are mounted on the motherboard without distorting the nests despite the weakened central portions of the nests. Distortion of the nests could prevent proper insertion of the modules in the nests and could impair electrical connections between components in the modules and components on the motherboard.

The nests extend over components and contact tails soldered on the motherboard and provide touch-prevention shields above the motherboard to protect components and tails on the motherboard from inadvertent contact when a module is or is not inserted into a nest.

The nests have sidewalls with recesses above the motherboard which provide space for mounting components and solder tails on the motherboard under the sidewalls of the nest. This facilitates placement of components on the motherboard to reduce the size of the motherboard.

The modules extend a distance above the nests so that vibrations or shocks transmitted to the assembly could relatively move the assembly and modules and impair electrical connections between module contacts and contacts on the motherboard. Impaired connections prevent proper operation of the system. Elastic interference fit connections secure the modules to the nests to prevent impaired electrical connections due to vibrations or shocks.

BRIEF SUMMARY OF THE DRAWINGS

FIG. 12 is a perspective view showing a module prior to insertion into a nest on the assembly;

FIG. 13 is an exploded horizontal sectional view through a nest arm and an adjacent interference fit portion of a module;

DESCRIPTION OF PREFERRED EMBODIMENT

Redundant power supply motherboard assembly 10 is removably mounted on DIN rail 12 and supports four redundant pairs of like power supply modules 14 and a similar geometry diagnostic module 16 mounted at one end of the assembly. The DIN rail typically extends vertically or horizontally along the back surface of a control cabinet.

In each assembly 10, adjacent redundant pairs of modules 14 supply DC power to each of four foundation fieldbus segments connected to the assembly. If one power supply module fails, an alarm circuit will indicate a power supply failure and the other power supply module will maintain power to the segment until the failed module is replaced. Fieldbus data signals are communicated through the assembly between the segments and a conventional host computer system. The data signals are isolated from the power supply modules by inductors.

Figure 6:
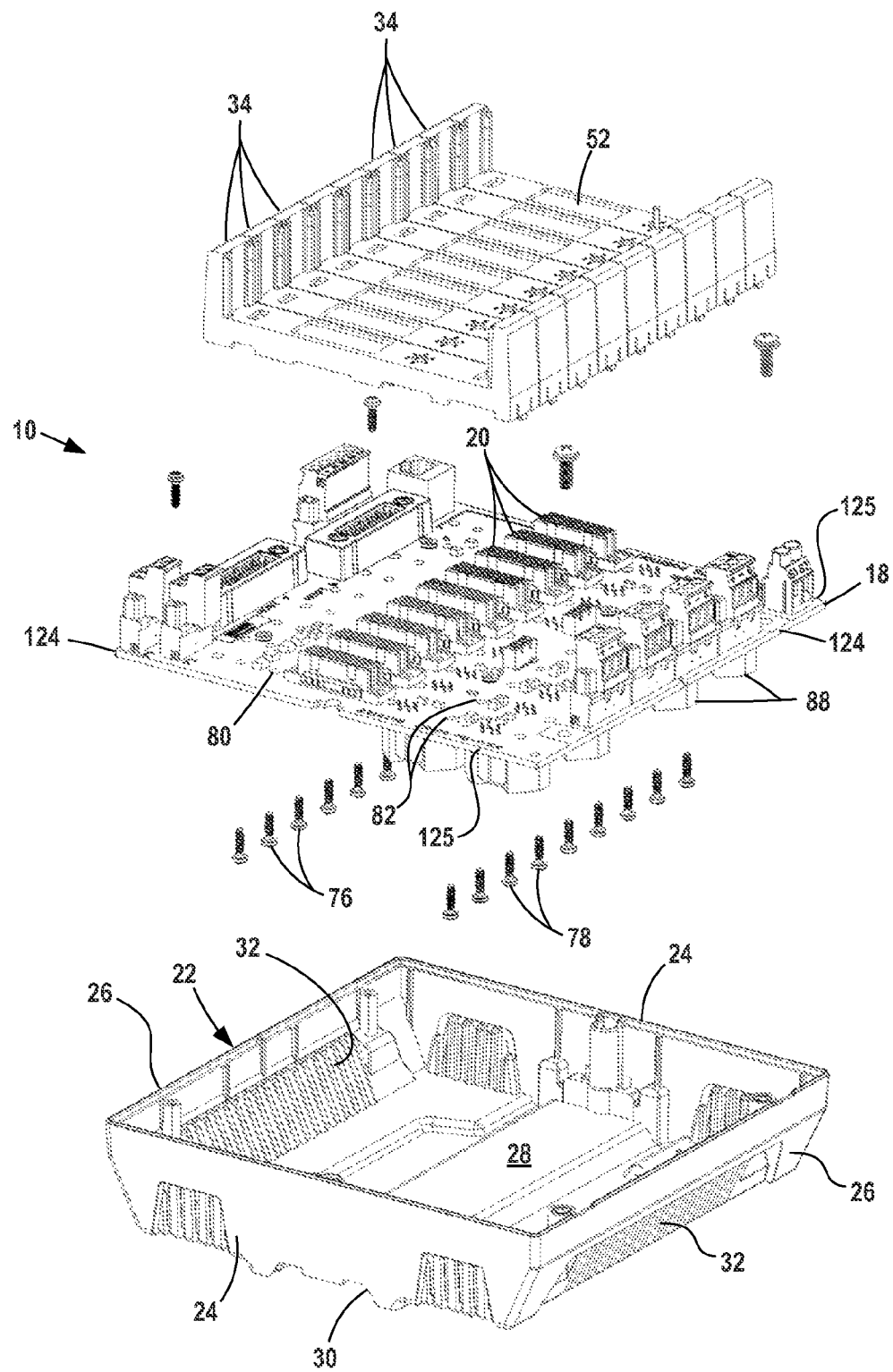
FIG. 6 is an exploded view of the assembly.
Figure 7:
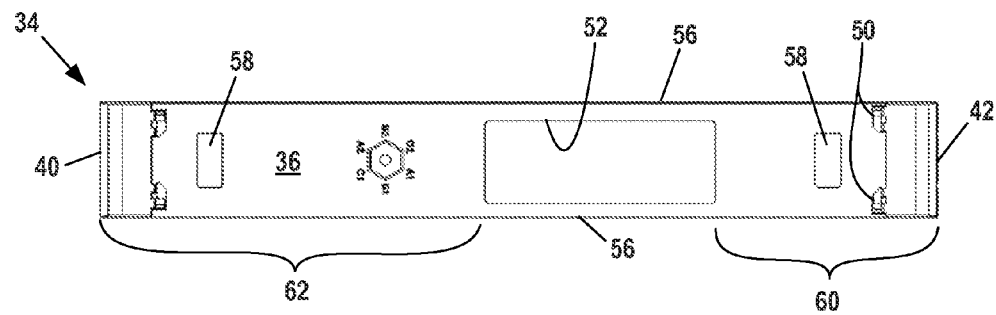
FIGS. 7, 8 and 9 are top, side and bottom views of a module nest.
Figure 8:
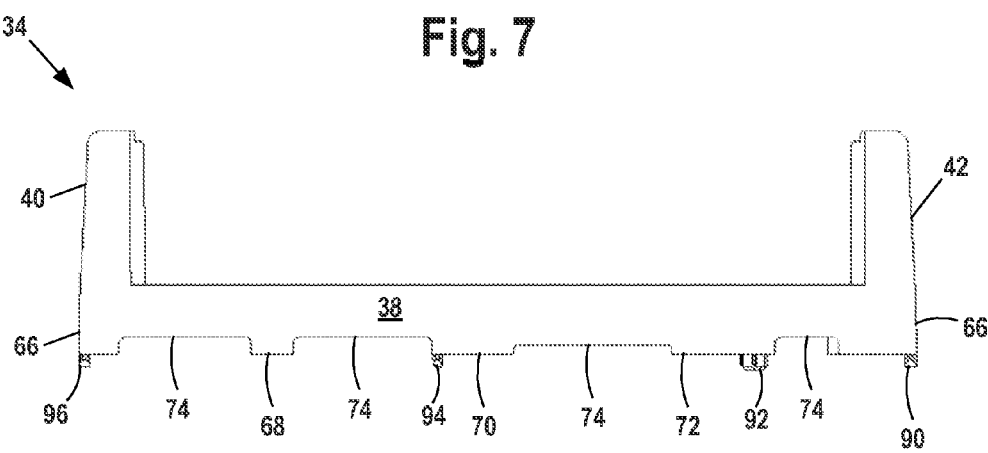
Figure 9:
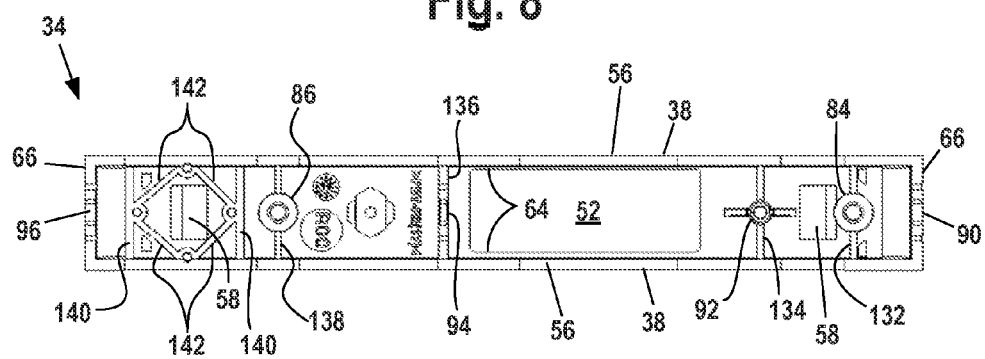
Figure 10:
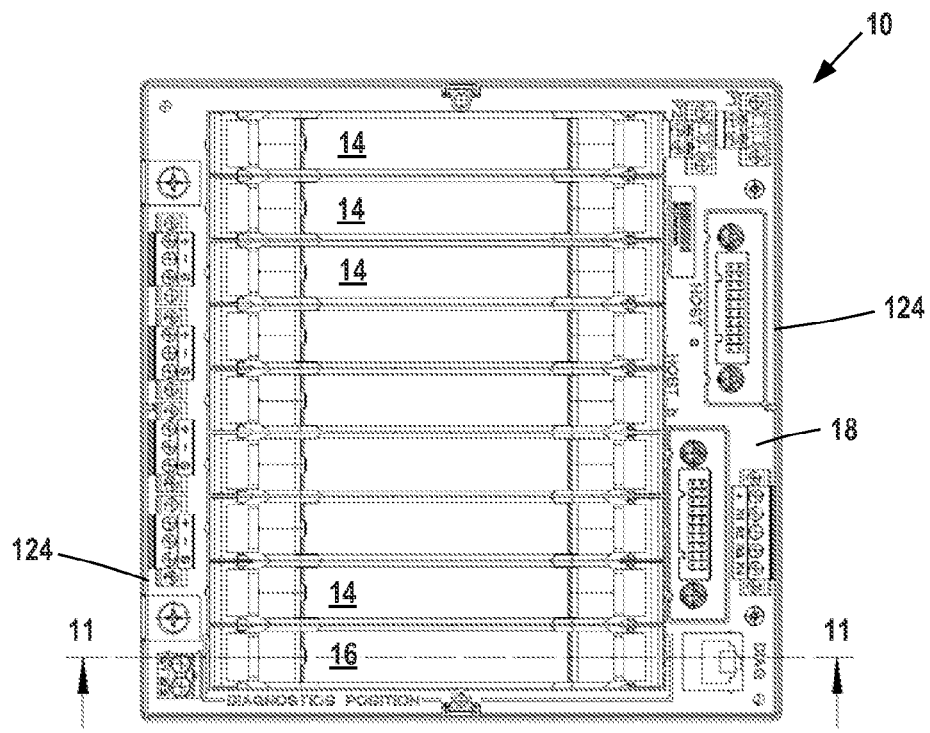
FIG. 10 is a top view of the assembly with modules installed.

As shown in FIG. 6, assembly 10 includes a square motherboard 18 with input and output connectors mounted on the top surface at opposed edges of the motherboard and nine module input/output connectors 20 mounted on the top of the motherboard and spaced across the length of the motherboard. Connectors 20 are located close together to minimize the length of the motherboard and facilitate side-by-side mounting of the modules on the motherboard with minimum clearance between adjacent modules. The closely spaced connectors 20 minimize the length of the motherboard. The width of the motherboard is minimized to reduce the size of the assembly and minimize the size of cabinets for the assemblies.

Motherboard 18 is mounted on the top of rectangular base 22. Base 22 is molded from a suitable thermoplastic resin. The base has opposed vertical end walls 24 which are joined by angled sidewalls 26. End modules are spaced short distances in from base end walls 24 to minimize the length of the assembly and reduce assembly size. Assembly 10 is square with a length and width of 180 mm.

Bottom wall 28 extends between the lower ends of walls 24 and 26. A DIN rail recess 30 is formed in the bottom wall and extends between end walls 24. Mounting hardware (not illustrated) on the bottom wall of base 22 removably mounts the base on DIN rail 12. Ventilation slots 32 are formed in walls 24 and 26.

The modules have a thickness of 17.5 mm. Modules 14 and 16 are the same shape and have similar bodies and latches as shown in U.S. Pat. No. 8,123,545.

Nine like, side-by-side module nests 34 are mounted on the top of motherboard 18. The nests are molded from thermoplastic resin. Module nests 34 are shown in FIGS. 7, 8, 9, 12, 15 and 16. Each nest 34 has a flat top wall 36, opposed vertical sidewalls 38 on either side of and extending down from the top wall 36, and two like vertically extending module support arms 40, 42 at the opposed ends of the nest. Arms 40 are on the fieldbus side 44 of the assembly. Arms 42 are on the host side 46 of the assembly. Arms 40 and 42 extend above wall 36. Each support arm 40, 42 has two vertical interior engagement ribs 48 and a pair of clamp ribs 50 outside of ribs 48. The clamp ribs extend vertically along the height of the arm from wall 36 to the top of the arm. Ribs 50 face each other and frictionally engage the opposed sides of a module rib when the module is inserted into a nest, as illustrated in FIG. 13 and described below.

Rectangular module connector opening 52 extends through wall 36 between arms 40 and 42. Openings 52 are sized to receive connectors 20 on the motherboard. The nest width and module thickness are essentially the same.

The portions of the nest 34 to either end of opening 52 are connected by strips 56 in walls 38 at opening 52. Strips are thin and can flex. Two latch openings 58 extend through wall 36 short distances inwardly from arms 40 and 42.

Connector opening 52 is located closer to support arm 42 than to support arm 40. As a result, nest 34 includes a short, rigid portion 60 extending from the end of opening 52 to arm 42 and a long, rigid portion 62 extending from opening 52 to support arm 40. Each rigid portion 60, 62 includes parts of the two sidewalls 38, part of top wall 36 and strengthening structural features located in the nest between the walls 38 and top wall 36. Rigid portions 60 and 62 are connected by strips 56 in walls 38 at opening 52. The edges of the opening 52 are spaced in from the tops of strips 56 by narrow shoulders 64. The shoulders 64 partially stiffen the strips.

Module nest 34 includes two U-shaped end feet 66 under support arms 40, 42, and middle feet 68, 70 and 72 on walls 38 between feet 66. Vertical recesses 74 are provided at the bottom of the nest sidewalls between feet 66 and 68, 68 and 70, and 72, and 72 and 66. The feet rest flush on the top surface of motherboard 18.

Each nest 34 is mounted on the top of motherboard 18 by two mounting screws 76 and 78. Screws 76 and 78 extend through holes 80 and 82 in the motherboard and are threaded into holes in mounting pillars 84 and 86 in the nest. Mounting pillar 84 is located under the inner edge of nest support arm 42 in the outer end of short rigid portion 60. Mounting pillar 86 is located inwardly from the nest arm 40 in the long rigid portion 62. Pillars 84 and 86 are located centrally between the nest sidewalls 38.

Inductors 88 are mounted on the bottom of the motherboard under the rigid portions 62 of two adjacent nests. The pillars 86 are positioned in from arms 40 at locations permitting access to and tightening of screws 78 mounting the nests on motherboard by a tool extended past the inductors. Mounting of the inductors directly on the bottom of the motherboard saves space and eliminates dependent circuit boards previously used to support inductors in conventional motherboard assemblies, mounting hardware, standoff components, and soldering and assembly operations.

Nest location posts 90, 92, 94 and 96 extend below the bottom of the nest feet centrally between the nest sidewalls. Location post 90 is under the outer end wall of arm 42 on nest short portion 60. Post 92 is located between pillar 84 and opening 52. Post 94 is located at the inner end of long portion 62 adjacent opening 52. Post 96 is located on the outer wall of arm 40 on nest long portion 62.

Figure 2:
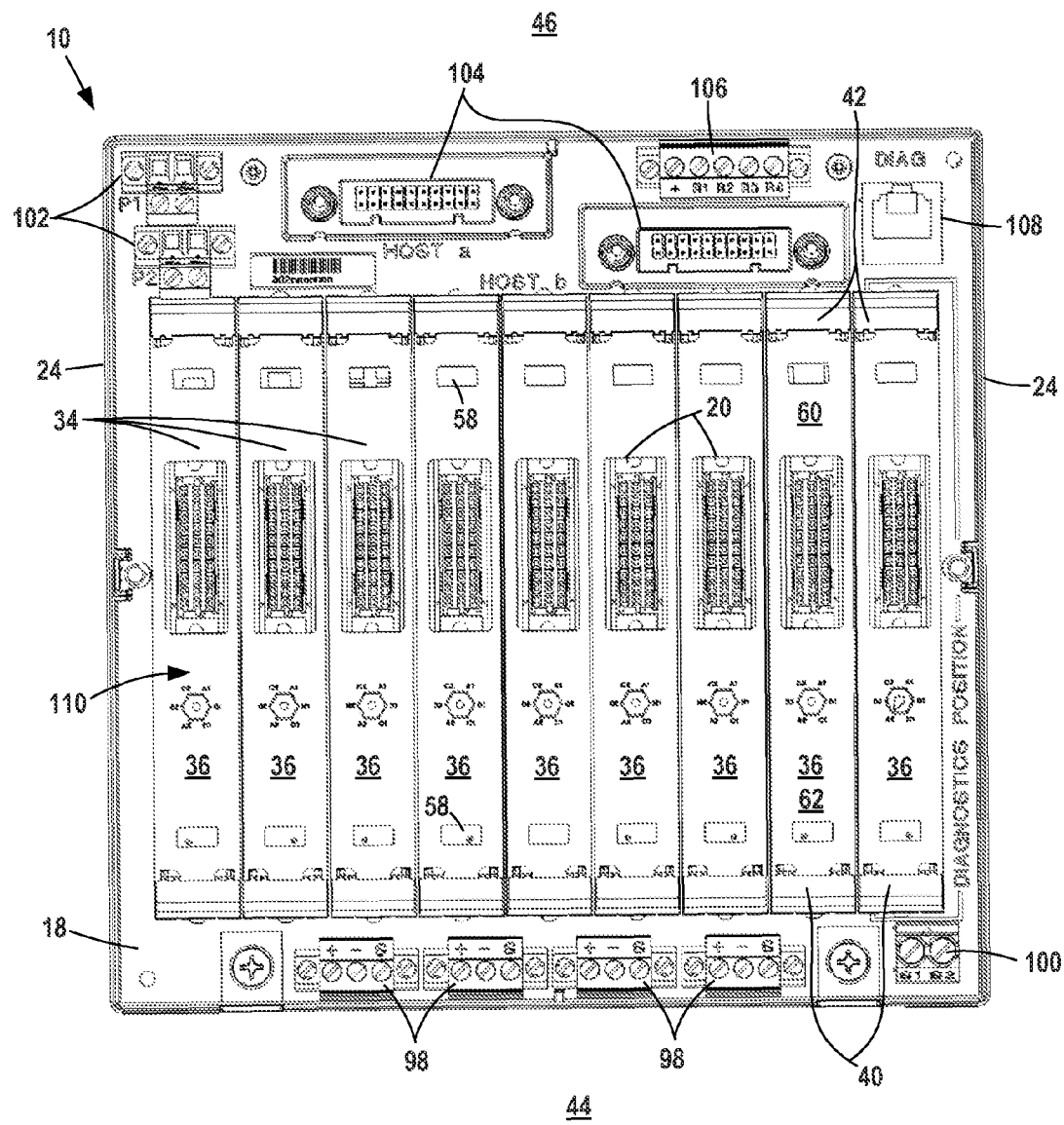
FIG. 2 is a top view of the assembly with the modules removed.
Figure 3:
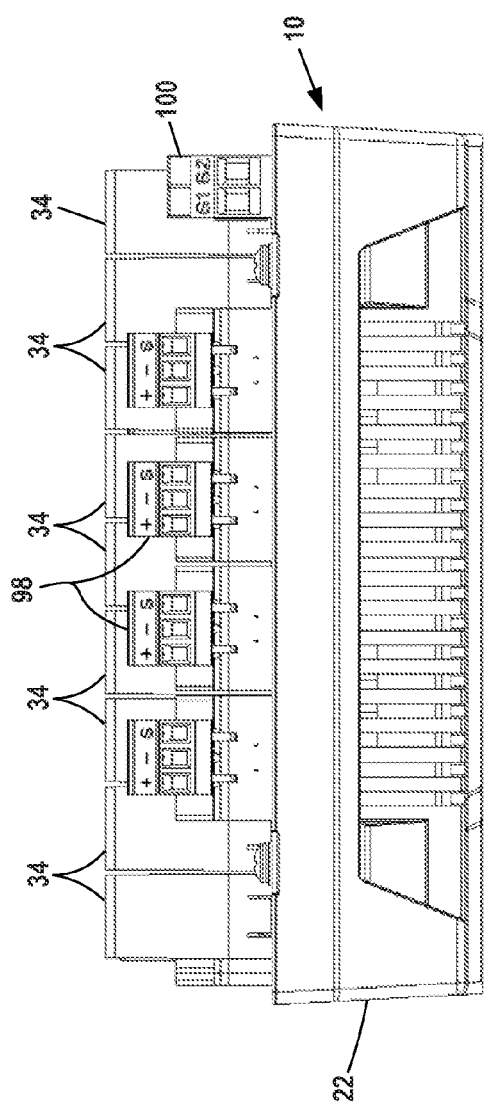
FIGS. 3 and 4 are views of the fieldbus and host sides of the assembly respectively.
Figure 4:
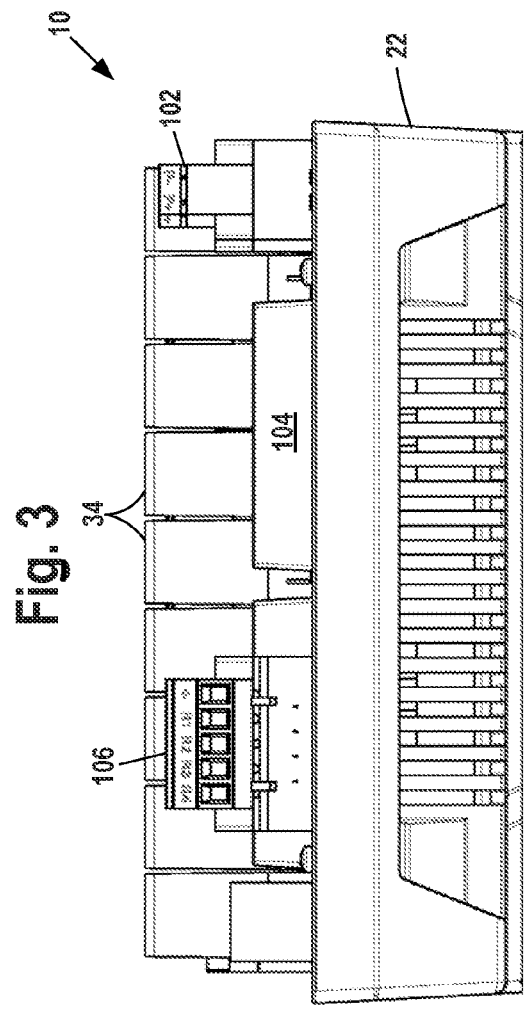

FIG. 2 illustrates the top of motherboard 18 with module nests 34 mounted on the motherboard and a number of electrical components and connectors mounted on the motherboard on the fieldbus side 44 of the assembly. The nests 34 are together side-by-side and extend along the length of the assembly between end walls 24. Four foundation fieldbus segment connectors 98 are mounted on motherboard 18 at the fieldbus side 44 adjacent to long, rigid nest arms 40. Ground terminals 100 are provided to one side of the connectors 98.

A number of connectors are mounted on the host side 46 of motherboard 18 adjacent to nest arms 42. Two pairs of bulk power input terminals 102 are provided at one corner of the motherboard to supply redundant bulk power supply to modules in the assembly. Two host cable connectors 104 on the motherboard provide redundant cable connections to a foundation fieldbus host computer system located away from the assembly. Alternatively, a single host cable connector may be provided for systems that utilize a non-redundant cable connection.

Five alarm monitor terminals 106 provide electrical connections between alarm circuits described below and a monitor for indicating failure of a power supply module 14. Diagnostic RJ45 Ethernet jack 108 supplies diagnostic information from diagnostic module 16 to the host computer system.

Electrical components necessary to the operation of assembly 10 are soldered to circuitry on the top and bottom surfaces of motherboard 18. Components mounted on the bottom of the motherboard may have solder tails extending through holes in the board and project a distance above the top of the board. Vertical recesses 74 on both nest sidewalls 38 provide space above the circuit board for these components and tails. The recesses are spaced away between feet 66, 68, 70 and 72. Components and tails on the motherboard can be freely positioned under the nest sidewalls 38 with the exception of the locations of the feet. Mounting of the nests 34 on the motherboard does not materially restrict efficient location of components on the motherboard at desired locations for spatial and electrical efficiency and minimizing the size of the motherboard. Recesses 74 and openings 52 vent air from the space between motherboard 18 and overlying nests 34 to reduce heat buildup.

Figure 11:
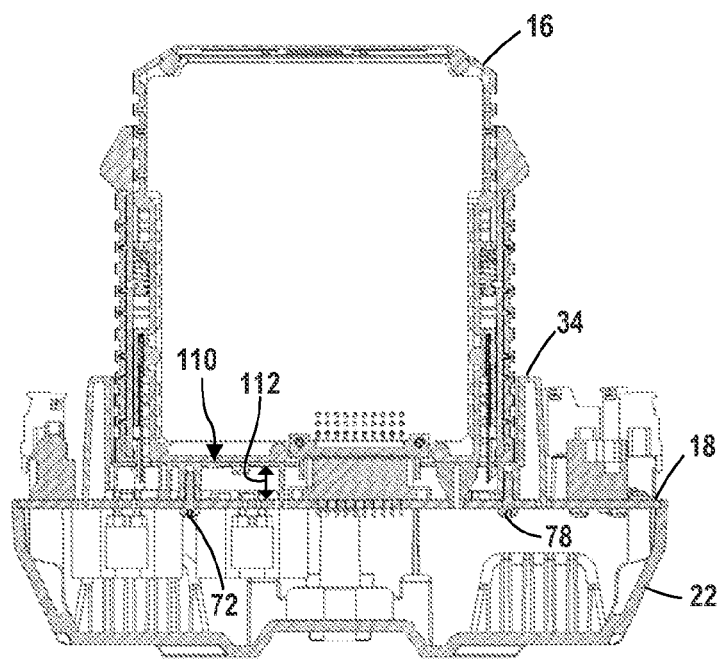
FIG. 11 is a vertical sectional view along line 11-11 of FIG. 10.

As shown in FIGS. 2 and 11, module nests 34 overlie all of the soldered electronic components and tails on the top surface of motherboard 18. The nest top walls 36 are positioned close together to form a flat, multi segment roof 110 extending across the length of the motherboard and overlying the components and tails on the top of the motherboard. Roof 110 is shown in FIGS. 2 and 11 and is located a height 112 above the top surface of the motherboard. Height 112 may be about 9 mm. Module connectors 20 are mounted on the motherboard and extend up distance 112, above the motherboard. The connectors 20 protrude through openings 52 in the nests to engage the noses 54 on the modules.

Distance 112 provides space under the roof for components mounted on the top of the motherboard and tails of components mounted on the bottom of the motherboard which extend through the motherboard. The roof 110 provides top touch protection for the components and tails to prevent inadvertent touching of the circuitry on the top of the motherboard. The end walls of the end nests located at the opposing ends of the assembly provide side touch protection for components on the top of the motherboard.

The roof 110 permits the assembly to meet touch protection requirements with components on the top surface of the motherboard. This facilitates compact location of components and reduction of the size of the motherboard and of the assembly. The modules are held in the nests above roof 110. The distance 112 between the roof and the motherboard provides space for efficient positioning of electronic components on the top of the motherboard.

Figure 17:
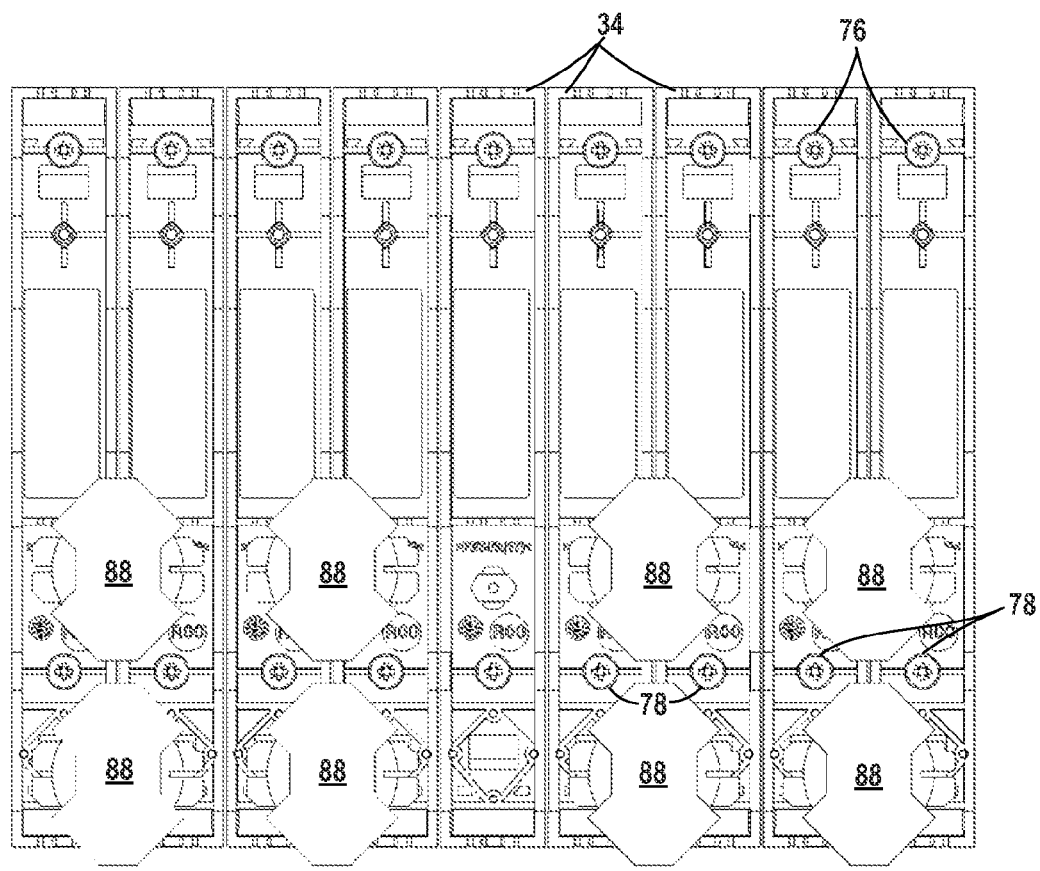
FIG. 17 is a bottom view of nests in the assembly with the motherboard removed and the locations of inductors mounted on the motherboard shown.

Eight inductors 88, shown in outline in FIG. 17, are mounted on the bottom of the motherboard at locations which permit mounting of the nests 34 on the motherboard by screws 78 despite the size of the inductors. The inductors 88 have minimum transverse dimensions greater than the width of nests 34 so that each inductor extends under two nests. Two inductors 88 are positioned under the long, rigid portions 62 of two adjacent nests. The positions of the inductors require the mounting screws 78 be located inwardly from the adjacent end of the nest. Each inductor is connected electrically to one power supply module 14. Inductors 88 block fieldbus data signals from entering the power supply modules, as required by Fieldbus Foundation standards.

The inductors 88 are mounted on the bottom of the motherboard at locations indicated in FIG. 17 in order to permit access to the underside of the motherboard by a tool used to engage and tighten mounting screws 78. The screws extend through screw holes 82 in motherboard 18 and into the cylindrical openings in mounting pillars 86 to secure the nests against the top surface of the motherboard.

Figure 14:
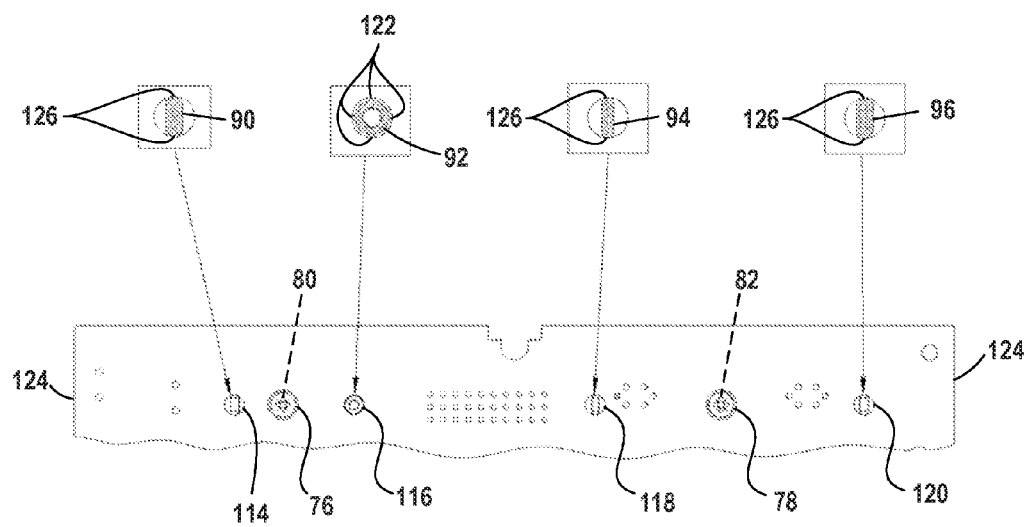
FIG. 14 is a bottom view of a motherboard showing location posts on a nest seated in through openings.
Figure 15:
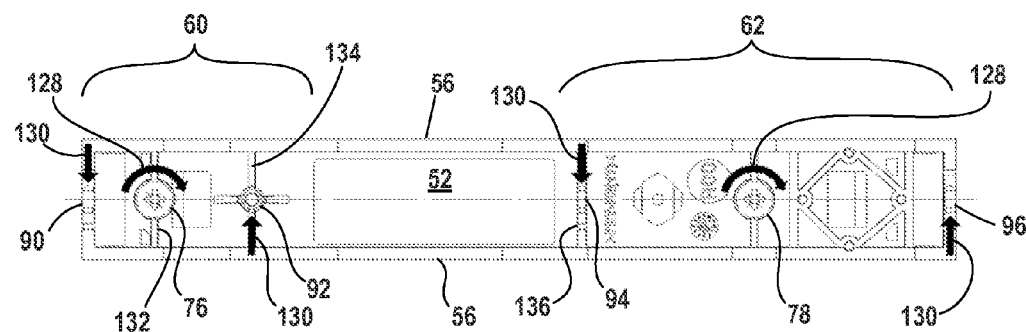
FIG. 15 is a view of the bottom of a nest as mounted on a motherboard with the motherboard removed.
Figure 16:
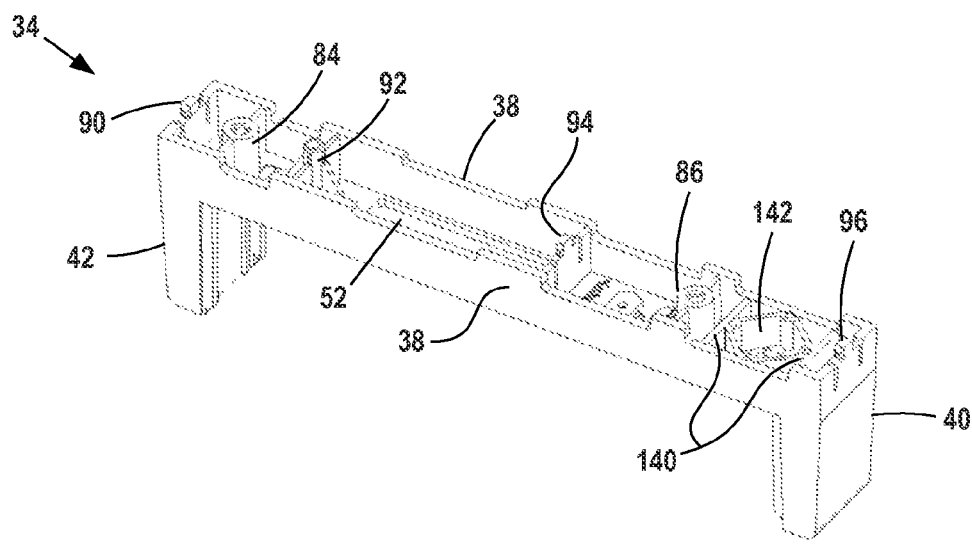
FIG. 16 is a perspective view of the bottom of a nest.

Each nest 34 is mounted on motherboard 18 by positioning module connector opening 52 above a module connector 20 and lowering the nest onto the upper surface of the motherboard so that feet 66, 68, 70 and 72 rest on the top of the motherboard and location posts 90, 92, 94 and 96 extend into circular post openings 114, 116, 118 and 120 which extend through the motherboard. The posts and openings are shown in FIG. 14.

Primary location post 92 contains four 90°-spaced alignment ribs 122 spaced around the post. The post has a snug fit in post opening 116. The engagement between ribs 122 and opening 116 accurately locates the nest between the opposed sides 124 of the motherboard, and between the opposed sides 125 of the motherboard.

Flat location posts 90, 94 and 96 have opposed rounded surfaces 126 which frictionally engage the surfaces on opposed sides of the respective post openings to assure desired orientation of the nest on the motherboard and also to allow slight longitudinal movement of the location posts in openings 114, 118 and 120. The flat posts 90, 94 and 96 may flex sideways. Together, the rounded surfaces on post 92 and the flexibility of posts 90, 94 and 96 accommodate misalignment between the posts and the openings due to the positional tolerances of each, assuring that the longitudinal location of the nest on the motherboard is determined by post 92.

Proper location of the module nests on the motherboard assures that the nests are in correct side-by-side alignment and that the connectors on the inserted modules properly engage the module connectors 20, despite tolerances inherent in circuit board manufacture and manufacture of the molded plastic nests.

The nests are held on the motherboards by mounting screws 76 and 78. Screws 76 are inserted through motherboard holes 80 and are threaded into the bores in mounting pillars 84 on the short rigid nest portions 60. Screws 78 are extended through motherboard holes 82 and are threadably inserted into the bores in pillars 86 in the long rigid nest portions 62.

Tightening of screws 76 and 78 into the pillars 84 and 86 rotates the threads on the screws into the bores in the pillars and exerts torque on the pillars in the direction of rotation of the screws. This torque is represented by arrows 128 illustrated in FIG. 15. The torque tends to rotate each of the rigid module portions 60 and 62 in a clockwise direction about the mounting pillars 84 and 86. Location posts 90 and 92 in openings 114 and 116 prevent rotation of rigid portion 60 during tightening of screws 76. Location posts 94 and 96 in openings 118 and 120 prevent rotation on rigid portions 62 during tightening of screws 78. In this way, the screws 76 and may be tightened to mount the nests on the motherboard without rotation of portions 60 and 62. In the absence of the anti-rotation posts 90-96, tightening of the screws could exert sufficient torque on portions 60 and 62 to rotate the portions, flex strips 56 at connector openings 52 and skew the nests on the board. Skewing of the nests on the board can misalign connector opening 52 and shift arms 40 and 42, making it difficult or impossible to mount the modules in the nests. The anti-rotation posts are biased against the sides of the post openings which resist rotation in the directions of arrows 130, shown in FIG. 15.

Figure 1:
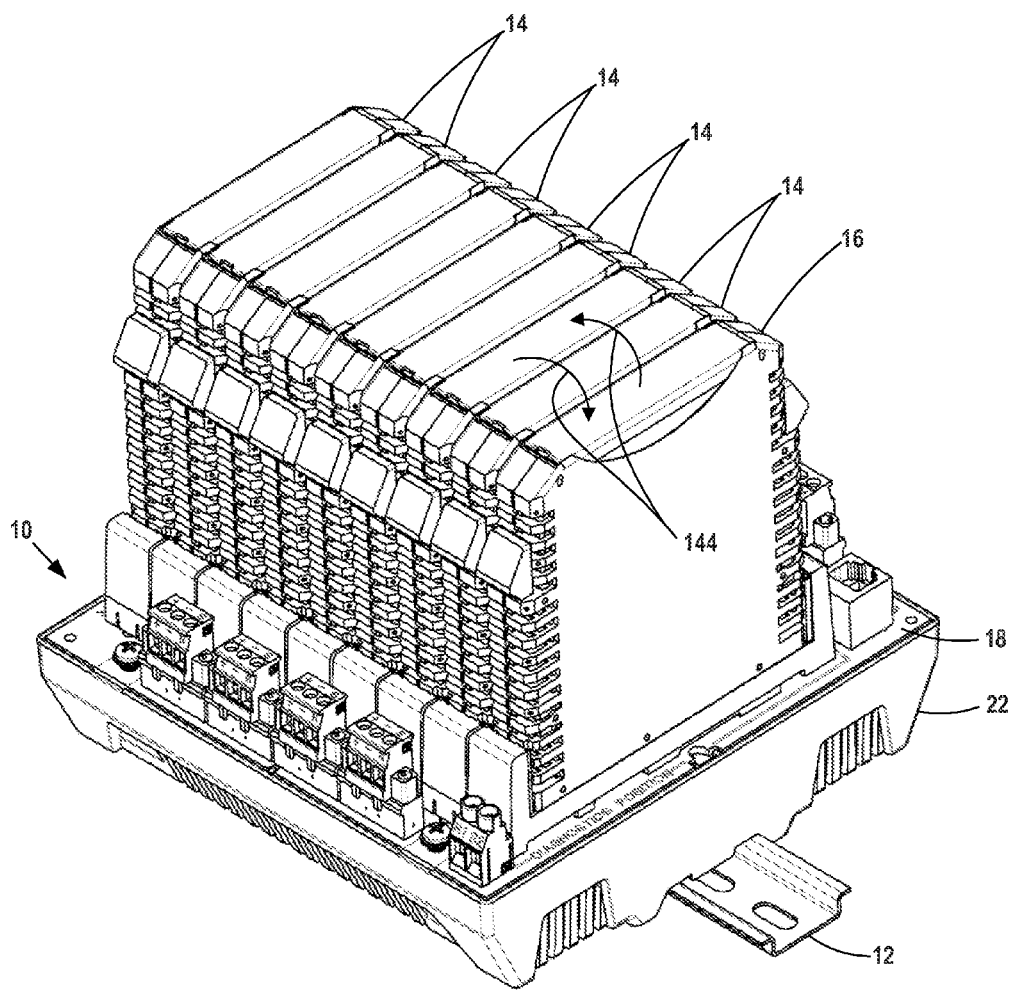
FIG. 1 is a perspective view of a redundant power supply motherboard assembly with mounted modules.

The interior of short rigid portion 60 includes transverse stiffening wall 132 at pillar 84 and transverse wall 134 at post 92. Long portion 62 includes interior stiffening transverse wall 136 at post 94, wall 138 at pillar 86, and a pair of transverse walls 140 and angled rhombic bracing walls 142 surrounding latch opening 58. These walls increase the stiffness of rigid portions 60 and 62 to prevent or reduce flexing of the portions and strips 56 when screws 76 and 78 are tightened or the modules 14, 16 are moved in the direction of arrows 144 in response to vibration, shock or handling. See FIG. 1.

Modules 14 and 16 have identical plastic bodies and identical contact noses 54 for engaging the nests and module connectors 20 mounted on motherboard 18. Opposed lower module edges 146 shown in FIG. 12 are identical in shape and include a series of vertically spaced horizontal ribs 148 and 150 with flat alignment surfaces 152 facing outwardly from the module. Ribs 148 have friction engagement surfaces 154 on both sides of the ribs. Surfaces 154 are spaced apart a thickness distance 156.

Ribs 48 on arms 40 and 42 have inwardly facing engagement surfaces 158. Ribs 50 have engagement surfaces 160 spaced apart a distance 162.

The thickness distance 156 between module friction engagement surfaces 154 on ribs 148 is 0.13 mm greater than the unstressed distance 162 between engagement surfaces 160 prior to insertion of a module into the nest. During insertion of a module into a nest, clamp ribs 50 are elastically moved outwardly about 0.13 mm by retention ribs 148.

Ribs 150 have a sliding fit between clamp ribs 50 on arms and 42. This facilitates initial free piloting of the insertion end of the module into the nest arms 40 and 42, with lower two ribs 150 freely movable between arm ribs 50.

Initial insertion of a module 14, 16 into a nest 34 moves the lower two ribs 150 on each module edge down between the two clamp ribs 50 on each arm 40, 42. Further insertion moves retention ribs 148 between clamp ribs 50. Insertion of ribs 148 between ribs 50 elastically and non-destructively flexes ribs 50 outwardly. The flexed ribs 50 clamp ribs 148 to the arms 40 and and hold the module in place. The surfaces 158 align the module for proper longitudinal engagement between nose 54 and connector 20. Surfaces 160 also align the module for proper lateral engagement between nose 54 and connector 20.

The non-destructive, elastic clamp connections between the module and the nest assure that the two are held together and prevent movement of the module in the directions of arrows 144 due to shock and vibration of the assembly or improper handling of the modules. The clamped connections prevent relative movement of the contacts in nose 54 and in connector 20 and impairment of electrical connections.

The module is inserted into the nest until module latches 164 extend through latch openings 58 and secure the module on the nest. At the same time, contact nose 54 is extended through the connector opening 52 in the nest and engages module connector 20 on motherboard 18.

Figure 5:
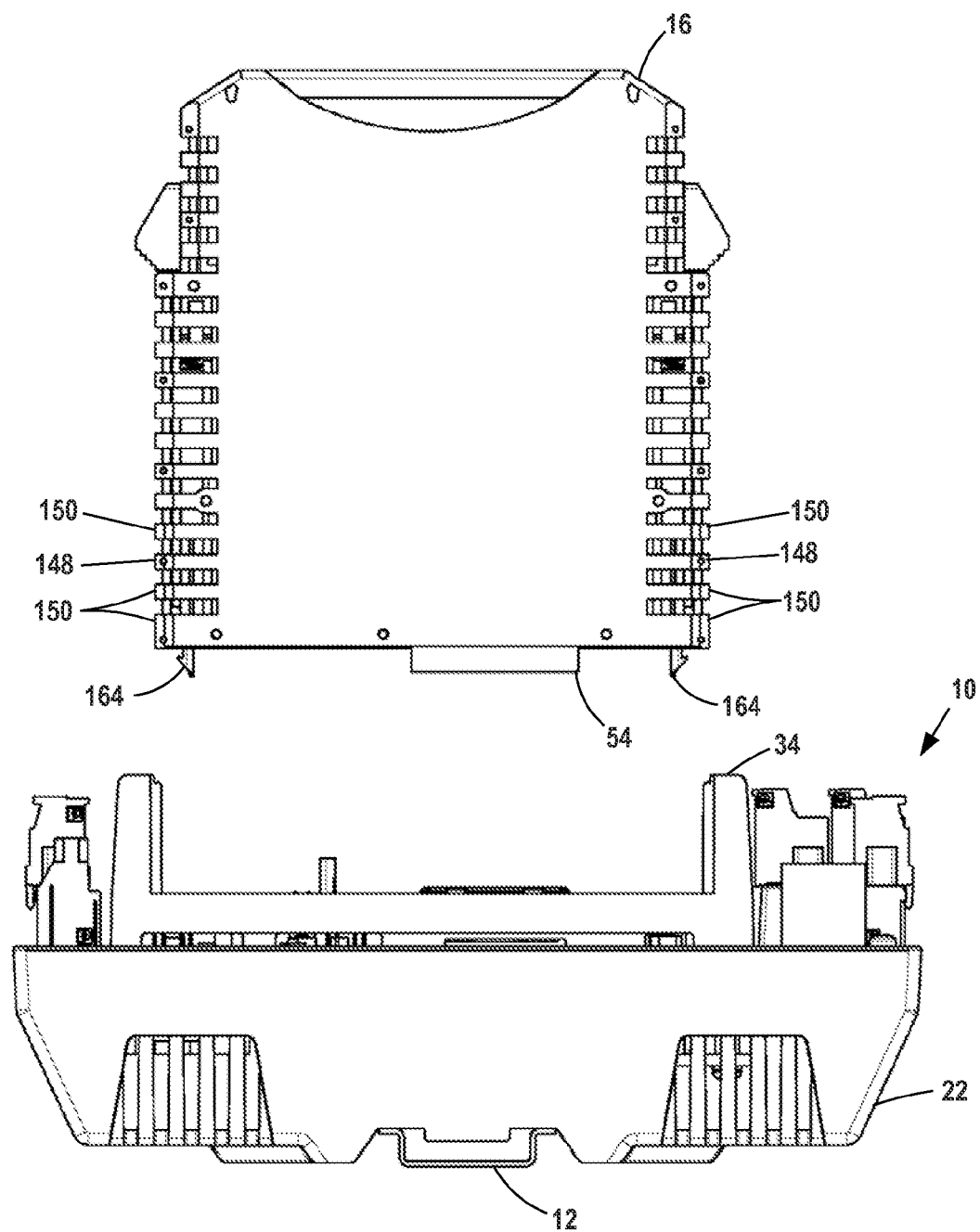
FIG. 5 is an end view of the assembly with a module in position to be mounted on the assembly.

The secure interference fit connection is required to secure the module to the nest because the module extends a distance above the nest. The height of the modules is approximately five times the height of the arms 40 and 42. See FIG. 5. This means that the physical connection must prevent sideways movement of the high modules in the nests in the directions of arrows 144 and potential resultant degradation of electrical connections. The physical connection also prevents vertical movement of the modules in the nests due to latch play.

The 0.13 mm interference fit between the side surfaces 154 and 160 assure elastic deformation of the ribs 50 when the modules are inserted, despite molding tolerances for the nests and the right and left module shells 166 illustrated in FIG. 13. The interference fits with elastic, not permanent, deformation of the ribs 50 on arms 40 and 42, securely hold the module in the nest while permitting repeated insertion and removal of modules into and from the nests.

What we claim as our invention is:

1. An assembly comprising a motherboard; a module connector on the motherboard; a nest on the motherboard, the nest comprising a body with opposed ends, a wall extending between the ends, a connector opening in the wall, and two module support members extending above the wall, a module support member at each end of the body, the connector opening aligned with the module connector; and an electronic module in the nest and extending above the module support members, the module comprising a contact nose engaging the module connector, and opposed module edges; two physical connections removably mounting the module edges in the module support members; each connection comprising two spaced module friction engagement surfaces, two spaced member friction engagement surfaces, each member friction engagement surface engaging a module friction engagement surface, and an elastically and non-destructively stressed first elastic member holding such friction engagement surfaces together, whereby said connections secure the module in the nest to prevent shocks, vibrations or handling of the module from impairing electrical connections between the contacts in the contact nose and in the module connector.

2. The assembly as in claim 1 wherein one of said surfaces is on the elastic member.

3. The assembly as in claim 2 wherein the elastic member comprises a first rib extending along the adjacent module edge.

4. The assembly as in claim 3 including a second rib holding such friction engagement surfaces together, another of said surfaces on said second rib.

5. The assembly as in claim 3 wherein said ribs are spaced apart a distance X when the ribs are not flexed, the friction engagement surfaces not on the ribs are spaced apart a distance Y, and the distance X is less than the distance Y.

6. The assembly as in claim 5 wherein the difference between distance X and distance Y is about 0.13 mm.

7. The assembly as in claim 1 wherein the module height is about five times greater than the support member height.

8. The assembly as in claim 7 including an engagement surface on each module support member, said engagement surfaces facing each other to align the module for engagement between the nose and the connector.

9. The assembly as in claim 8 including an alignment rib on each module support member, said engagement surfaces on such ribs.

10. The assembly as in claim 1 wherein each module edge comprises a plurality of spaced horizontal ribs, said module friction engagement surfaces on opposite sides of one horizontal rib only.

11. The assembly as in claim 1 wherein the body includes two rigid portions, each rigid portion on one side of the connector opening, and the sidewalls include two strips joining said rigid portions at the connector opening.

12. The assembly as in claim 11 wherein each sidewall comprises feet engaging the motherboard and vertical recesses between adjacent feet.

13. The assembly as in claim 1 wherein the body is formed from thermoplastic resin.

14. An assembly comprising a motherboard; a module connector on the motherboard; a nest on the motherboard, the nest comprising an elongate body with opposed ends, a wall extending between the ends, a connector opening in the wall aligned with the module connector, and a first module support member at one end of the body; and an electronic module in the nest, the module comprising a portion extending above the nest, a contact nose engaging the module connector, a first module edge, and a first friction engagement surface on the module edge; said module support member comprising a first member friction engagement surface; an elastically and non-destructively flexible member on either said module edge or said support member, one of said module friction engagement surfaces or said support member friction engagement surfaces located on said flexible member; the module inserted in the nest with said module and member friction engagement surfaces engaging each other and said flexible member stressed to hold such surfaces together to form a frictional fit securing the module in the nest, said fit preventing shocks, vibrations or handling of the modules from impairing electrical connections between contacts in the contact nose and in the module connector.

15. The assembly as in claim 14 where the height of the module is about five times the height of the module support member.

16. The assembly as in claim 15 including a second module friction engagement surface and a second member friction engagement surface, such surfaces engaging each other.

17. The assembly as in claim 14 wherein the nest comprises a second module support member, and said module comprises a second module edge, said second module edge in said second support member.

18. The assembly as in claim 15 wherein the body is formed from thermoplastic resin.

\* \* \* \* \*